United States Patent
Hogg

(10) Patent No.: US 9,060,420 B2
(45) Date of Patent: Jun. 16, 2015

(54) METHOD OF MANUFACTURING A DOUBLE SIDED FLEX CIRCUIT FOR A DISK DRIVE WHEREIN A FIRST SIDE LEAD PROVIDES AN ETCHING MASK FOR A SECOND SIDE LEAD

(75) Inventor: Dennis W. Hogg, Laguna Hills, CA (US)

(73) Assignee: Western Digitial Technologies, Inc., Irvine, CA (US)

( * ) Notice: Subject to any disclaimer, the term of this patent is extended or adjusted under 35 U.S.C. 154(b) by 770 days.

(21) Appl. No.: 13/118,545

(22) Filed: May 30, 2011

(65) Prior Publication Data

US 2011/0226729 A1    Sep. 22, 2011

Related U.S. Application Data

(62) Division of application No. 11/933,759, filed on Nov. 1, 2007, now abandoned.

(51) Int. Cl.
*H05K 3/06* (2006.01)
*H05K 3/10* (2006.01)
(Continued)

(52) U.S. Cl.
CPC ......... *H05K 3/0082* (2013.01); *Y10T 29/49155* (2015.01); *Y10T 29/49025* (2015.01);
(Continued)

(58) Field of Classification Search
CPC ....... H05K 3/061; H05K 3/062; H05K 3/108; H05K 3/184; H05K 2203/0597; G11B 5/486; G03F 7/0002; G03F 7/0007; Y10T 29/49025; Y10T 29/49124; Y10T 29/49147; Y10T 29/49155; Y10T 29/49156; Y10T 29/49165

USPC .............. 29/829, 846, 847, 842, 852, 603.03; 430/313, 318; 216/13, 18, 39, 48
See application file for complete search history.

(56) References Cited

U.S. PATENT DOCUMENTS

| 5,458,763 A | * | 10/1995 | Kobayashi et al. .......... 216/18 X |
| 5,501,943 A | * | 3/1996 | Swirbel ........................ 430/313 |

(Continued)

FOREIGN PATENT DOCUMENTS

| CN | 200810169024.4 | 3/2012 |
| CN | 1178985 A1 | 8/2014 |
| HK | 1128357 | 9/2012 |
| JP | 02281685 A * | 11/1990 ....................... 29/829 |

OTHER PUBLICATIONS

Office Action dated Nov. 10, 2010 from U.S. Appl. No. 11/933,759, 6 pages.

(Continued)

*Primary Examiner* — A. Dexter Tugbang

(57) ABSTRACT

A method of manufacturing a flex circuit is disclosed for a disk drive comprising a disk, a head actuated radially over the disk, and control circuitry. The flex circuit is for electrically coupling the head to the control circuitry and comprises a substrate. An electrical coating applied to a first side of the substrate is etched to form a first electrical lead. The first side of the substrate is irradiated with radiation such that the first electrical lead masks the radiation from passing through the substrate to prevent curing of a photoresist applied to the second side of the substrate to form an uncured photoresist and a cured photoresist on the second side of the substrate. The uncured photoresist is removed from the second side of the substrate to form a groove, and the groove is filled with electrically conductive material to form the second electrical lead.

6 Claims, 3 Drawing Sheets

(51) Int. Cl.
  *G11B 5/48* (2006.01)
  *H05K 3/00* (2006.01)
  *H05K 3/04* (2006.01)
  *H05K 3/18* (2006.01)

(52) U.S. Cl.
  CPC ...... *Y10T 29/49124* (2015.01); *Y10T 29/49147* (2015.01); *Y10T 29/49156* (2015.01); *Y10T 29/49165* (2015.01); *G11B 5/486* (2013.01); *H05K 3/048* (2013.01); *H05K 3/06* (2013.01); *H05K 3/184* (2013.01); *H05K 2201/0108* (2013.01); *H05K 2201/09672* (2013.01); *H05K 2203/0551* (2013.01)

(56) References Cited

U.S. PATENT DOCUMENTS

| | | | |
|---|---|---|---|
| 5,597,496 A | 1/1997 | Masaichi et al. | |
| 5,694,270 A | 12/1997 | Sone et al. | |
| 5,737,152 A | 4/1998 | Balakrishnan | |
| 5,796,552 A | 8/1998 | Akin, Jr. et al. | |
| 5,800,723 A | 9/1998 | Juskey et al. | |
| 5,812,344 A | 9/1998 | Balakrishnan | |
| 5,883,759 A | 3/1999 | Schulz | |
| 5,986,853 A | 11/1999 | Simmons et al. | |
| 5,995,328 A | 11/1999 | Balakrishnan | |
| 6,018,789 A | 1/2000 | Sokolov et al. | |
| 6,065,095 A | 5/2000 | Sokolov et al. | |
| 6,078,452 A | 6/2000 | Kittilson et al. | |
| 6,081,447 A | 6/2000 | Lofgren et al. | |
| 6,092,149 A | 7/2000 | Hicken et al. | |
| 6,092,150 A | 7/2000 | Sokolov et al. | |
| 6,094,707 A | 7/2000 | Sokolov et al. | |
| 6,105,104 A | 8/2000 | Guttmann et al. | |
| 6,111,717 A | 8/2000 | Cloke et al. | |
| 6,145,052 A | 11/2000 | Howe et al. | |
| 6,150,071 A | 11/2000 | Harvey et al. | |
| 6,175,893 B1 | 1/2001 | D'Souza et al. | |
| 6,178,056 B1 | 1/2001 | Cloke et al. | |
| 6,191,909 B1 | 2/2001 | Cloke et al. | |
| 6,195,218 B1 | 2/2001 | Guttmann et al. | |
| 6,205,494 B1 | 3/2001 | Williams | |
| 6,208,477 B1 | 3/2001 | Cloke et al. | |
| 6,223,303 B1 | 4/2001 | Billings et al. | |
| 6,230,233 B1 | 5/2001 | Lofgren et al. | |
| 6,246,346 B1 | 6/2001 | Cloke et al. | |
| 6,249,393 B1 | 6/2001 | Billings et al. | |
| 6,256,695 B1 | 7/2001 | Williams | |
| 6,262,857 B1 | 7/2001 | Hull et al. | |
| 6,263,459 B1 | 7/2001 | Schibilla | |
| 6,272,694 B1 | 8/2001 | Weaver et al. | |
| 6,278,568 B1 | 8/2001 | Cloke et al. | |
| 6,278,585 B1 | 8/2001 | Olson et al. | |
| 6,279,089 B1 | 8/2001 | Schibilla et al. | |
| 6,289,484 B1 | 9/2001 | Rothberg et al. | |
| 6,292,912 B1 | 9/2001 | Cloke et al. | |
| 6,310,740 B1 | 10/2001 | Dunbar et al. | |
| 6,317,850 B1 | 11/2001 | Rothberg | |
| 6,327,106 B1 | 12/2001 | Rothberg | |
| 6,337,778 B1 | 1/2002 | Gagne | |
| 6,369,969 B1 | 4/2002 | Christiansen et al. | |
| 6,384,999 B1 | 5/2002 | Schibilla | |
| 6,388,833 B1 | 5/2002 | Golowka et al. | |
| 6,405,342 B1 | 6/2002 | Lee | |
| 6,408,357 B1 | 6/2002 | Hanmann et al. | |
| 6,408,406 B1 | 6/2002 | Parris | |
| 6,411,452 B1 | 6/2002 | Cloke | |
| 6,411,458 B1 | 6/2002 | Billings et al. | |
| 6,412,083 B1 | 6/2002 | Rothberg et al. | |
| 6,415,349 B1 | 7/2002 | Hull et al. | |
| 6,425,128 B1 | 7/2002 | Krapf et al. | |
| 6,441,981 B1 | 8/2002 | Cloke et al. | |
| 6,442,328 B1 | 8/2002 | Elliott et al. | |
| 6,445,524 B1 | 9/2002 | Nazarian et al. | |
| 6,449,767 B1 | 9/2002 | Krapf et al. | |
| 6,453,115 B1 | 9/2002 | Boyle | |
| 6,470,420 B1 | 10/2002 | Hospodor | |
| 6,480,020 B1 | 11/2002 | Jung et al. | |
| 6,480,349 B1 | 11/2002 | Kim et al. | |
| 6,480,932 B1 | 11/2002 | Vallis et al. | |
| 6,483,986 B1 | 11/2002 | Krapf | |
| 6,487,032 B1 | 11/2002 | Cloke et al. | |
| 6,487,047 B1 | 11/2002 | Balakrishnan | |
| 6,490,635 B1 | 12/2002 | Holmes | |
| 6,493,173 B1 | 12/2002 | Kim et al. | |
| 6,493,190 B1 | 12/2002 | Coon | |
| 6,499,083 B1 | 12/2002 | Hamlin | |
| 6,519,104 B1 | 2/2003 | Cloke et al. | |
| 6,525,892 B1 | 2/2003 | Dunbar et al. | |
| 6,545,830 B1 | 4/2003 | Briggs et al. | |
| 6,546,489 B1 | 4/2003 | Frank, Jr. et al. | |
| 6,550,021 B1 | 4/2003 | Dalphy et al. | |
| 6,552,880 B1 | 4/2003 | Dunbar et al. | |
| 6,553,457 B1 | 4/2003 | Wilkins et al. | |
| 6,578,106 B1 | 6/2003 | Price | |
| 6,580,573 B1 | 6/2003 | Hull et al. | |
| 6,594,183 B1 | 7/2003 | Lofgren et al. | |
| 6,600,620 B1 | 7/2003 | Krounbi et al. | |
| 6,601,137 B1 | 7/2003 | Castro et al. | |
| 6,603,622 B1 | 8/2003 | Christiansen et al. | |
| 6,603,625 B1 | 8/2003 | Hospodor et al. | |
| 6,604,220 B1 | 8/2003 | Lee | |
| 6,606,682 B1 | 8/2003 | Dang et al. | |
| 6,606,714 B1 | 8/2003 | Thelin | |
| 6,606,717 B1 | 8/2003 | Yu et al. | |
| 6,611,393 B1 | 8/2003 | Nguyen et al. | |
| 6,615,312 B1 | 9/2003 | Hamlin et al. | |
| 6,639,748 B1 | 10/2003 | Christiansen et al. | |
| 6,647,481 B1 | 11/2003 | Luu et al. | |
| 6,654,193 B1 | 11/2003 | Thelin | |
| 6,657,810 B1 | 12/2003 | Kupferman | |
| 6,661,591 B1 | 12/2003 | Rothberg | |
| 6,665,772 B1 | 12/2003 | Hamlin | |
| 6,687,073 B1 | 2/2004 | Kupferman | |
| 6,687,078 B1 | 2/2004 | Kim | |
| 6,687,850 B1 | 2/2004 | Rothberg | |
| 6,690,523 B1 | 2/2004 | Nguyen et al. | |
| 6,690,882 B1 | 2/2004 | Hanmann et al. | |
| 6,691,198 B1 | 2/2004 | Hamlin | |
| 6,691,213 B1 | 2/2004 | Luu et al. | |
| 6,691,255 B1 | 2/2004 | Rothberg et al. | |
| 6,693,760 B1 | 2/2004 | Krounbi et al. | |
| 6,694,477 B1 | 2/2004 | Lee | |
| 6,697,914 B1 | 2/2004 | Hospodor et al. | |
| 6,704,153 B1 | 3/2004 | Rothberg et al. | |
| 6,708,251 B1 | 3/2004 | Boyle et al. | |
| 6,710,951 B1 | 3/2004 | Cloke | |
| 6,711,628 B1 | 3/2004 | Thelin | |
| 6,711,635 B1 | 3/2004 | Wang | |
| 6,711,660 B1 | 3/2004 | Milne et al. | |
| 6,715,044 B2 | 3/2004 | Lofgren et al. | |
| 6,724,982 B1 | 4/2004 | Hamlin | |
| 6,725,329 B1 | 4/2004 | Ng et al. | |
| 6,735,650 B1 | 5/2004 | Rothberg | |
| 6,735,693 B1 | 5/2004 | Hamlin | |
| 6,744,772 B1 | 6/2004 | Eneboe et al. | |
| 6,745,283 B1 | 6/2004 | Dang | |
| 6,751,402 B1 | 6/2004 | Elliott et al. | |
| 6,757,481 B1 | 6/2004 | Nazarian et al. | |
| 6,772,281 B2 | 8/2004 | Hamlin | |
| 6,781,826 B1 | 8/2004 | Goldstone et al. | |
| 6,782,449 B1 | 8/2004 | Codilian et al. | |
| 6,791,779 B1 | 9/2004 | Singh et al. | |
| 6,792,486 B1 | 9/2004 | Hanan et al. | |
| 6,799,274 B1 | 9/2004 | Hamlin | |
| 6,811,427 B2 | 11/2004 | Garrett et al. | |
| 6,826,003 B1 | 11/2004 | Subrahmanyam | |
| 6,826,614 B1 | 11/2004 | Hanmann et al. | |
| 6,832,041 B1 | 12/2004 | Boyle | |
| 6,832,929 B2 | 12/2004 | Garrett et al. | |
| 6,845,405 B1 | 1/2005 | Thelin | |
| 6,845,427 B1 | 1/2005 | Atai-Azimi | |
| 6,850,443 B2 | 2/2005 | Lofgren et al. | |
| 6,851,055 B1 | 2/2005 | Boyle et al. | |

(56) References Cited

U.S. PATENT DOCUMENTS

| | | |
|---|---|---|
| 6,851,063 B1 | 2/2005 | Boyle et al. |
| 6,853,731 B1 | 2/2005 | Boyle et al. |
| 6,854,022 B1 | 2/2005 | Thelin |
| 6,862,660 B1 | 3/2005 | Wilkins et al. |
| 6,880,043 B1 | 4/2005 | Castro et al. |
| 6,882,486 B1 | 4/2005 | Kupferman |
| 6,884,085 B1 | 4/2005 | Goldstone |
| 6,888,831 B1 | 5/2005 | Hospodor et al. |
| 6,892,217 B1 | 5/2005 | Hanmann et al. |
| 6,892,249 B1 | 5/2005 | Codilian et al. |
| 6,892,313 B1 | 5/2005 | Codilian et al. |
| 6,895,455 B1 | 5/2005 | Rothberg |
| 6,895,500 B1 | 5/2005 | Rothberg |
| 6,898,730 B1 | 5/2005 | Hanan |
| 6,910,099 B1 | 6/2005 | Wang et al. |
| 6,928,470 B1 | 8/2005 | Hamlin |
| 6,931,439 B1 | 8/2005 | Hanmann et al. |
| 6,934,104 B1 | 8/2005 | Kupferman |
| 6,934,713 B2 | 8/2005 | Schwartz et al. |
| 6,940,873 B2 | 9/2005 | Boyle et al. |
| 6,943,978 B1 | 9/2005 | Lee |
| 6,948,165 B1 | 9/2005 | Luu et al. |
| 6,950,267 B1 | 9/2005 | Liu et al. |
| 6,954,733 B1 | 10/2005 | Ellis et al. |
| 6,961,814 B1 | 11/2005 | Thelin et al. |
| 6,965,489 B1 | 11/2005 | Lee et al. |
| 6,965,563 B1 | 11/2005 | Hospodor et al. |
| 6,965,966 B1 | 11/2005 | Rothberg et al. |
| 6,967,799 B1 | 11/2005 | Lee |
| 6,968,422 B1 | 11/2005 | Codilian et al. |
| 6,968,450 B1 | 11/2005 | Rothberg et al. |
| 6,973,495 B1 | 12/2005 | Milne et al. |
| 6,973,570 B1 | 12/2005 | Hamlin |
| 6,976,190 B1 | 12/2005 | Goldstone |
| 6,983,316 B1 | 1/2006 | Milne et al. |
| 6,986,007 B1 | 1/2006 | Procyk et al. |
| 6,986,154 B1 | 1/2006 | Price et al. |
| 6,995,933 B1 | 2/2006 | Codilian et al. |
| 6,996,501 B1 | 2/2006 | Rothberg |
| 6,996,669 B1 | 2/2006 | Dang et al. |
| 7,002,926 B1 | 2/2006 | Eneboe et al. |
| 7,003,674 B1 | 2/2006 | Hamlin |
| 7,006,316 B1 | 2/2006 | Sargenti, Jr. et al. |
| 7,009,820 B1 | 3/2006 | Hogg |
| 7,023,639 B1 | 4/2006 | Kupferman |
| 7,024,491 B1 | 4/2006 | Hanmann et al. |
| 7,024,549 B1 | 4/2006 | Luu et al. |
| 7,024,614 B1 | 4/2006 | Thelin et al. |
| 7,027,716 B1 | 4/2006 | Boyle et al. |
| 7,028,174 B1 | 4/2006 | Atai-Azimi et al. |
| 7,031,902 B1 | 4/2006 | Catiller |
| 7,046,465 B1 | 5/2006 | Kupferman |
| 7,046,488 B1 | 5/2006 | Hogg |
| 7,050,252 B1 | 5/2006 | Vallis |
| 7,054,937 B1 | 5/2006 | Milne et al. |
| 7,055,000 B1 | 5/2006 | Severtson |
| 7,055,167 B1 | 5/2006 | Masters |
| 7,057,836 B1 | 6/2006 | Kupferman |
| 7,062,398 B1 | 6/2006 | Rothberg |
| 7,075,746 B1 | 7/2006 | Kupferman |
| 7,076,604 B1 | 7/2006 | Thelin |
| 7,082,494 B1 | 7/2006 | Thelin et al. |
| 7,088,538 B1 | 8/2006 | Codilian et al. |
| 7,088,545 B1 | 8/2006 | Singh et al. |
| 7,092,186 B1 | 8/2006 | Hogg |
| 7,095,577 B1 | 8/2006 | Codilian et al. |
| 7,099,095 B1 | 8/2006 | Subrahmanyam et al. |
| 7,106,537 B1 | 9/2006 | Bennett |
| 7,106,947 B2 | 9/2006 | Boyle et al. |
| 7,110,202 B1 | 9/2006 | Vasquez |
| 7,111,116 B1 | 9/2006 | Boyle et al. |
| 7,114,029 B1 | 9/2006 | Thelin |
| 7,120,737 B1 | 10/2006 | Thelin |
| 7,120,806 B1 | 10/2006 | Codilian et al. |
| 7,126,776 B1 | 10/2006 | Warren, Jr. et al. |
| 7,129,763 B1 | 10/2006 | Bennett et al. |
| 7,133,600 B1 | 11/2006 | Boyle |
| 7,136,244 B1 | 11/2006 | Rothberg |
| 7,146,094 B1 | 12/2006 | Boyle |
| 7,149,046 B1 | 12/2006 | Coker et al. |
| 7,150,036 B1 | 12/2006 | Milne et al. |
| 7,155,616 B1 | 12/2006 | Hamlin |
| 7,171,108 B1 | 1/2007 | Masters et al. |
| 7,171,110 B1 | 1/2007 | Wilshire |
| 7,194,576 B1 | 3/2007 | Boyle |
| 7,200,698 B1 | 4/2007 | Rothberg |
| 7,205,805 B1 | 4/2007 | Bennett |
| 7,206,497 B1 | 4/2007 | Boyle et al. |
| 7,215,496 B1 | 5/2007 | Kupferman et al. |
| 7,215,771 B1 | 5/2007 | Hamlin |
| 7,237,054 B1 | 6/2007 | Cain et al. |
| 7,240,161 B1 | 7/2007 | Boyle |
| 7,249,365 B1 | 7/2007 | Price et al. |
| 7,263,709 B1 | 8/2007 | Krapf |
| 7,274,639 B1 | 9/2007 | Codilian et al. |
| 7,274,659 B2 | 9/2007 | Hospodor |
| 7,275,116 B1 | 9/2007 | Hanmann et al. |
| 7,280,302 B1 | 10/2007 | Masiewicz |
| 7,292,774 B1 | 11/2007 | Masters et al. |
| 7,292,775 B1 | 11/2007 | Boyle et al. |
| 7,296,284 B1 | 11/2007 | Price et al. |
| 7,302,501 B1 | 11/2007 | Cain et al. |
| 7,302,579 B1 | 11/2007 | Cain et al. |
| 7,318,088 B1 | 1/2008 | Mann |
| 7,319,806 B1 | 1/2008 | Willner et al. |
| 7,325,244 B2 | 1/2008 | Boyle et al. |
| 7,330,323 B1 | 2/2008 | Singh et al. |
| 7,346,790 B1 | 3/2008 | Klein |
| 7,366,641 B1 | 4/2008 | Masiewicz et al. |
| 7,369,340 B1 | 5/2008 | Dang et al. |
| 7,369,343 B1 | 5/2008 | Yeo et al. |
| 7,372,650 B1 | 5/2008 | Kupferman |
| 7,380,147 B1 | 5/2008 | Sun |
| 7,392,340 B1 | 6/2008 | Dang et al. |
| 7,404,013 B1 | 7/2008 | Masiewicz |
| 7,406,545 B1 | 7/2008 | Rothberg et al. |
| 7,415,571 B1 | 8/2008 | Hanan |
| 7,436,610 B1 | 10/2008 | Thelin |
| 7,437,502 B1 | 10/2008 | Coker |
| 7,440,214 B1 | 10/2008 | Ell et al. |
| 7,451,344 B1 | 11/2008 | Rothberg |
| 7,471,483 B1 | 12/2008 | Ferris et al. |
| 7,471,486 B1 | 12/2008 | Coker et al. |
| 7,486,060 B1 | 2/2009 | Bennett |
| 7,496,493 B1 | 2/2009 | Stevens |
| 7,518,819 B1 | 4/2009 | Yu et al. |
| 7,526,184 B1 | 4/2009 | Parkinen et al. |
| 7,539,924 B1 | 5/2009 | Vasquez et al. |
| 7,543,117 B1 | 6/2009 | Hanan |
| 7,551,383 B1 | 6/2009 | Kupferman |
| 7,562,282 B1 | 7/2009 | Rothberg |
| 7,577,973 B1 | 8/2009 | Kapner, III et al. |
| 7,596,797 B1 | 9/2009 | Kapner, III et al. |
| 7,599,139 B1 | 10/2009 | Bombet et al. |
| 7,619,841 B1 | 11/2009 | Kupferman |
| 7,647,544 B1 | 1/2010 | Masiewicz |
| 7,649,704 B1 | 1/2010 | Bombet et al. |
| 7,653,927 B1 | 1/2010 | Kapner, III et al. |
| 7,656,603 B1 | 2/2010 | Xing |
| 7,656,763 B1 | 2/2010 | Jin et al. |
| 7,657,149 B2 | 2/2010 | Boyle |
| 7,672,072 B1 | 3/2010 | Boyle et al. |
| 7,673,075 B1 | 3/2010 | Masiewicz |
| 7,688,540 B1 | 3/2010 | Mei et al. |
| 7,724,461 B1 | 5/2010 | McFadyen et al. |
| 7,725,584 B1 | 5/2010 | Hanmann et al. |
| 7,730,295 B1 | 6/2010 | Lee |
| 7,760,458 B1 | 7/2010 | Trinh |
| 7,768,776 B1 | 8/2010 | Szeremeta et al. |
| 7,804,657 B1 | 9/2010 | Hogg et al. |
| 7,813,954 B1 | 10/2010 | Price et al. |
| 7,827,320 B1 | 11/2010 | Stevens |
| 7,839,588 B1 | 11/2010 | Dang et al. |
| 7,843,660 B1 | 11/2010 | Yeo |

(56) References Cited

U.S. PATENT DOCUMENTS

| | | |
|---|---|---|
| 7,852,596 B2 | 12/2010 | Boyle et al. |
| 7,859,782 B1 | 12/2010 | Lee |
| 7,872,822 B1 | 1/2011 | Rothberg |
| 7,898,756 B1 | 3/2011 | Wang |
| 7,898,762 B1 | 3/2011 | Guo et al. |
| 7,900,037 B1 | 3/2011 | Fallone et al. |
| 7,907,364 B2 | 3/2011 | Boyle et al. |
| 7,929,234 B1 | 4/2011 | Boyle et al. |
| 7,933,087 B1 | 4/2011 | Tsai et al. |
| 7,933,090 B1 | 4/2011 | Jung et al. |
| 7,934,030 B1 | 4/2011 | Sargenti, Jr. et al. |
| 7,940,491 B2 | 5/2011 | Szeremeta et al. |
| 7,944,639 B1 | 5/2011 | Wang |
| 7,945,727 B2 | 5/2011 | Rothberg et al. |
| 7,949,564 B1 | 5/2011 | Hughes et al. |
| 7,974,029 B2 | 7/2011 | Tsai et al. |
| 7,974,039 B1 | 7/2011 | Xu et al. |
| 7,982,993 B1 | 7/2011 | Tsai et al. |
| 7,984,200 B1 | 7/2011 | Bombet et al. |
| 7,990,648 B1 | 8/2011 | Wang |
| 7,992,179 B1 | 8/2011 | Kapner, III et al. |
| 8,004,785 B1 | 8/2011 | Tsai et al. |
| 8,006,027 B1 | 8/2011 | Stevens et al. |
| 8,014,094 B1 | 9/2011 | Jin |
| 8,014,977 B1 | 9/2011 | Masiewicz et al. |
| 8,019,914 B1 | 9/2011 | Vasquez et al. |
| 8,040,625 B1 | 10/2011 | Boyle et al. |
| 8,078,943 B1 | 12/2011 | Lee |
| 8,079,045 B2 | 12/2011 | Krapf et al. |
| 8,082,433 B1 | 12/2011 | Fallone et al. |
| 8,085,487 B1 | 12/2011 | Jung et al. |
| 8,089,719 B1 | 1/2012 | Dakroub |
| 8,090,902 B1 | 1/2012 | Bennett et al. |
| 8,090,906 B1 | 1/2012 | Blaha et al. |
| 8,091,112 B1 | 1/2012 | Elliott et al. |
| 8,094,396 B1 | 1/2012 | Zhang et al. |
| 8,094,401 B1 | 1/2012 | Peng et al. |
| 8,116,020 B1 | 2/2012 | Lee |
| 8,116,025 B1 | 2/2012 | Chan et al. |
| 8,134,793 B1 | 3/2012 | Vasquez et al. |
| 8,134,798 B1 | 3/2012 | Thelin et al. |
| 8,139,301 B1 | 3/2012 | Li et al. |
| 8,139,310 B1 | 3/2012 | Hogg |
| 8,144,419 B1 | 3/2012 | Liu |
| 8,145,452 B1 | 3/2012 | Masiewicz et al. |
| 8,149,528 B1 | 4/2012 | Suratman et al. |
| 8,154,812 B1 | 4/2012 | Boyle et al. |
| 8,159,768 B1 | 4/2012 | Miyamura |
| 8,161,328 B1 | 4/2012 | Wilshire |
| 8,164,849 B1 | 4/2012 | Szeremeta et al. |
| 8,174,780 B1 | 5/2012 | Tsai et al. |
| 8,190,575 B1 | 5/2012 | Ong et al. |
| 8,194,338 B1 | 6/2012 | Zhang |
| 8,194,340 B1 | 6/2012 | Boyle et al. |
| 8,194,341 B1 | 6/2012 | Boyle |
| 8,201,066 B1 | 6/2012 | Wang |
| 8,271,692 B1 | 9/2012 | Dinh et al. |
| 8,279,550 B1 | 10/2012 | Hogg |
| 8,281,218 B1 | 10/2012 | Ybarra et al. |
| 8,285,923 B2 | 10/2012 | Stevens |
| 8,289,656 B1 | 10/2012 | Huber |
| 8,305,705 B1 | 11/2012 | Roohr |
| 8,307,156 B1 | 11/2012 | Codilian et al. |
| 8,310,775 B1 | 11/2012 | Boguslawski et al. |
| 8,315,006 B1 | 11/2012 | Chahwan et al. |
| 8,316,263 B1 | 11/2012 | Gough et al. |
| 8,320,067 B1 | 11/2012 | Tsai et al. |
| 8,324,974 B1 | 12/2012 | Bennett |
| 8,332,695 B2 | 12/2012 | Dalphy et al. |
| 8,341,337 B1 | 12/2012 | Ong et al. |
| 8,350,628 B1 | 1/2013 | Bennett |
| 8,356,184 B1 | 1/2013 | Meyer et al. |
| 8,370,683 B1 | 2/2013 | Ryan et al. |
| 8,375,225 B1 | 2/2013 | Ybarra |
| 8,375,274 B1 | 2/2013 | Bonke |
| 8,380,922 B1 | 2/2013 | DeForest et al. |
| 8,390,948 B2 | 3/2013 | Hogg |
| 8,390,952 B1 | 3/2013 | Szeremeta |
| 8,392,689 B1 | 3/2013 | Lott |
| 8,407,393 B1 | 3/2013 | Yolar et al. |
| 8,413,010 B1 | 4/2013 | Vasquez et al. |
| 8,417,566 B2 | 4/2013 | Price et al. |
| 8,421,663 B1 | 4/2013 | Bennett |
| 8,422,172 B1 | 4/2013 | Dakroub et al. |
| 8,427,771 B1 | 4/2013 | Tsai |
| 8,429,343 B1 | 4/2013 | Tsai |
| 8,433,937 B1 | 4/2013 | Wheelock et al. |
| 8,433,977 B1 | 4/2013 | Vasquez et al. |
| 8,458,526 B2 | 6/2013 | Dalphy et al. |
| 8,462,466 B2 | 6/2013 | Huber |
| 8,467,151 B1 | 6/2013 | Huber |
| 8,489,841 B1 | 7/2013 | Strecke et al. |
| 8,493,679 B1 | 7/2013 | Boguslawski et al. |
| 8,498,074 B1 | 7/2013 | Mobley et al. |
| 8,499,198 B1 | 7/2013 | Messenger et al. |
| 8,512,049 B1 | 8/2013 | Huber et al. |
| 8,514,506 B1 | 8/2013 | Li et al. |
| 8,531,791 B1 | 9/2013 | Reid et al. |
| 8,554,741 B1 | 10/2013 | Malina |
| 8,560,759 B1 | 10/2013 | Boyle et al. |
| 8,565,053 B1 | 10/2013 | Chung |
| 8,576,511 B1 | 11/2013 | Coker et al. |
| 8,578,100 B1 | 11/2013 | Huynh et al. |
| 8,578,242 B1 | 11/2013 | Burton et al. |
| 8,589,773 B1 | 11/2013 | Wang et al. |
| 8,593,753 B1 | 11/2013 | Anderson |
| 8,595,432 B1 | 11/2013 | Vinson et al. |
| 8,599,510 B1 | 12/2013 | Fallone |
| 8,601,248 B2 | 12/2013 | Thorsted |
| 8,611,032 B2 | 12/2013 | Champion et al. |
| 8,612,650 B1 | 12/2013 | Carrie et al. |
| 8,612,706 B1 | 12/2013 | Madril et al. |
| 8,612,798 B1 | 12/2013 | Tsai |
| 8,619,383 B1 | 12/2013 | Jung et al. |
| 8,621,115 B1 | 12/2013 | Bombet et al. |
| 8,621,133 B1 | 12/2013 | Boyle |
| 8,626,463 B2 | 1/2014 | Stevens et al. |
| 8,630,052 B1 | 1/2014 | Jung et al. |
| 8,630,056 B1 | 1/2014 | Ong |
| 8,631,188 B1 | 1/2014 | Heath et al. |
| 8,634,158 B1 | 1/2014 | Chahwan et al. |
| 8,635,412 B1 | 1/2014 | Wilshire |
| 8,640,007 B1 | 1/2014 | Schulze |
| 8,654,619 B1 | 2/2014 | Cheng |
| 8,661,193 B1 | 2/2014 | Cobos et al. |
| 8,667,248 B1 | 3/2014 | Neppalli |
| 8,670,205 B1 | 3/2014 | Malina et al. |
| 8,683,295 B1 | 3/2014 | Syu et al. |
| 8,683,457 B1 | 3/2014 | Hughes et al. |
| 8,687,306 B1 | 4/2014 | Coker et al. |
| 8,693,133 B1 | 4/2014 | Lee et al. |
| 8,694,841 B1 | 4/2014 | Chung et al. |
| 8,699,159 B1 | 4/2014 | Malina |
| 8,699,171 B1 | 4/2014 | Boyle |
| 8,699,172 B1 | 4/2014 | Gunderson et al. |
| 8,699,175 B1 | 4/2014 | Olds et al. |
| 8,699,185 B1 | 4/2014 | Teh et al. |
| 8,700,850 B1 | 4/2014 | Lalouette |
| 8,743,502 B1 | 6/2014 | Bonke et al. |
| 8,749,910 B1 | 6/2014 | Dang et al. |
| 8,751,699 B1 | 6/2014 | Tsai et al. |
| 8,755,141 B1 | 6/2014 | Dang |
| 8,755,143 B2 | 6/2014 | Wilson et al. |
| 8,756,361 B1 | 6/2014 | Pruett et al. |
| 8,756,382 B1 | 6/2014 | Carlson et al. |
| 8,769,593 B1 | 7/2014 | Elliott et al. |
| 8,773,802 B1 | 7/2014 | Anderson et al. |
| 8,780,478 B1 | 7/2014 | Huynh et al. |
| 8,782,334 B1 | 7/2014 | Boyle et al. |
| 8,793,532 B1 | 7/2014 | Tsai et al. |
| 8,797,669 B1 | 8/2014 | Burton |
| 8,799,977 B1 | 8/2014 | Kapner, III et al. |
| 2004/0247921 A1 | 12/2004 | Dodsworth et al. |
| 2007/0133128 A1 | 6/2007 | Arai |

(56) References Cited

U.S. PATENT DOCUMENTS

| | | |
|---|---|---|
| 2009/0113702 A1 | 5/2009 | Hogg |
| 2010/0306551 A1 | 12/2010 | Meyer et al. |
| 2011/0226729 A1 | 9/2011 | Hogg |
| 2012/0159042 A1 | 6/2012 | Lott et al. |
| 2012/0275050 A1 | 11/2012 | Wilson et al. |
| 2012/0281963 A1 | 11/2012 | Krapf et al. |
| 2012/0324980 A1 | 12/2012 | Nguyen et al. |
| 2014/0201424 A1 | 7/2014 | Chen et al. |

OTHER PUBLICATIONS

Office Action dated Dec. 10, 2010 from U.S. Appl. No. 11/933,759, 7 pages.

Office Action dated Apr. 28, 2011 from U.S. Appl. No. 11/933,759, 5 pages.

Dennis W. Hogg, Office Action dated: Aug. 8, 2011 for Chinese Patent Application Serial No. 200810169024.4, filed Oct. 14, 2008, 20 pages.

* cited by examiner

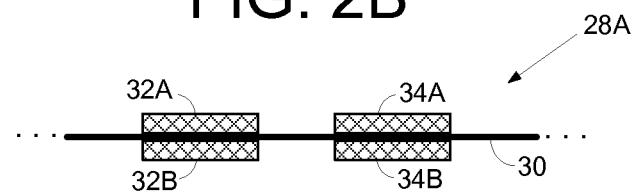
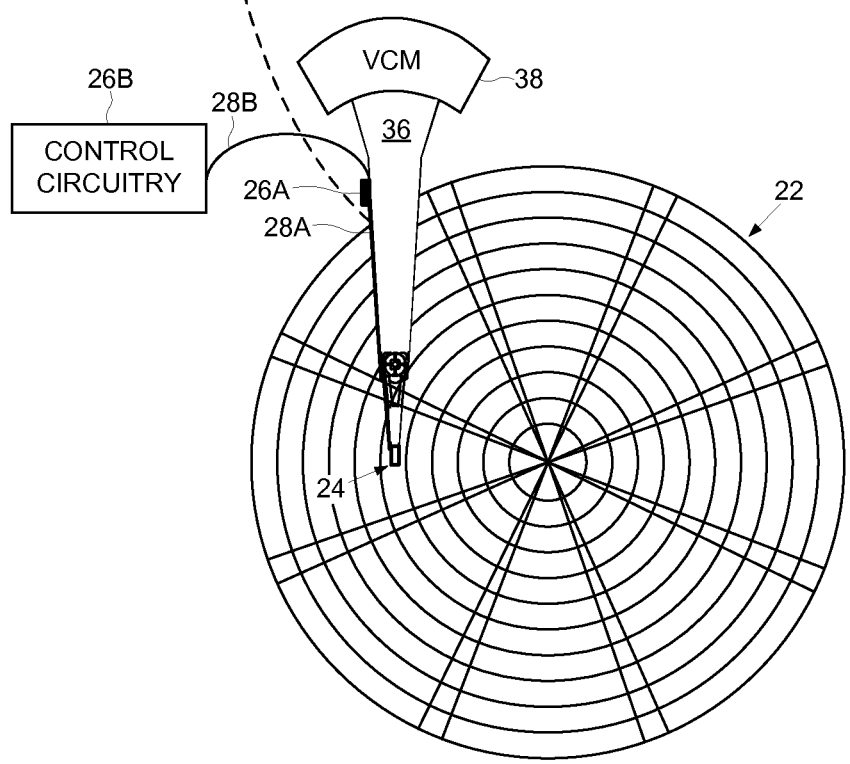

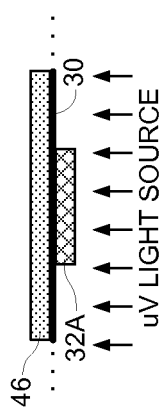
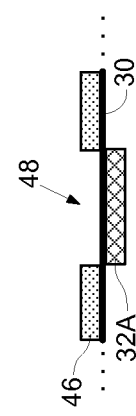
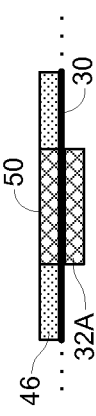
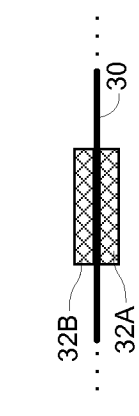
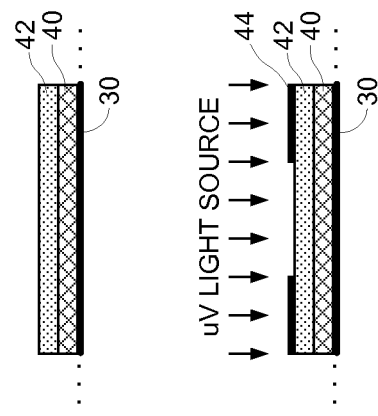
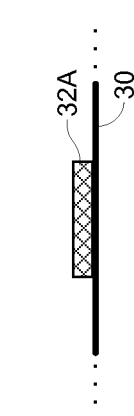
FIG. 3A  FIG. 3B  FIG. 3C  FIG. 3D  FIG. 3E  FIG. 3F  FIG. 3G  FIG. 3H

METHOD OF MANUFACTURING A DOUBLE SIDED FLEX CIRCUIT FOR A DISK DRIVE WHEREIN A FIRST SIDE LEAD PROVIDES AN ETCHING MASK FOR A SECOND SIDE LEAD

This application is a divisional of U.S. patent application Ser. No. 11/933,759 filed on Nov. 1, 2007 the specification of which is incorporated herein by reference.

BACKGROUND

1. Field

The present invention relates to disk drives for computer systems. In particular, the present invention relates to a disk drive comprising a double sided flex circuit wherein a first side lead provides an etching mask for a second side lead.

2. Description of the Related Art

FIG. 1A shows a prior art disk drive comprising a disk 2 and a head 4 connected to a distal end of an actuator arm 6 which is rotated about a pivot by a voice coil motor (VCM) 8 to position the head 4 radially over the disk 2. The head 4 may comprise an inductive write element (write coil) and a magnetoresistive read element (MR element) fabricated in very small dimensions using semiconductor fabrication techniques. A flex circuit 10 is typically employed to electrically couple the head 4 to control circuitry within the disk drive. In the example shown in FIG. 1A, a first flex circuit 10A couples the head 4 to a preamp 12A mounted on the actuator arm 6, and a second flex circuit 10B couples the preamp 12A to other control circuitry 12B mounted on a printed circuit board, wherein the second flex circuit 10B facilitates the movement of the actuator arm 6. In other disk drives, the preamp 12A may be integrated with control circuitry 12B such that flex circuit 10A couples the head 4 directly to the control circuitry 12B mounted on the printed circuit board.

FIG. 1B shows a magnified cross-sectional view of the flex circuit 10A as comprising electrical leads for carrying differential signals, such as a differential write signal 14A and 14B and a differential read signal 16A and 16B for the head 4. The electrical leads are supported by a substrate 18 which may comprise any suitable material, such as a polyimide. The electrical leads are typically formed using conventional etching techniques on one side of the substrate 18 such that the electrical leads for carrying the differential signal are separated by an air gap (e.g., air gap 20A and 20B).

As the data rate in disk drives increases into the microwave region, the transmission properties of the electrical leads for carrying the differential signals has become more significant. For example, it is desirable to reduce the impedance of the electrical leads in order to increase power efficiency as well as the signal-to-noise ratio (SNR) of the differential signal.

There is, therefore, a need in a disk drive to reduce the impedance of the electrical leads fabricated on a flex circuit in order to improve the power efficiency and SNR in transmitting differential signals along the electrical leads.

BRIEF DESCRIPTION OF THE DRAWINGS

FIG. 2A shows a disk drive according to an embodiment of the present invention comprising a head actuated over a disk and a flex circuit for coupling the head to control circuitry.

FIG. 2B shows a flex circuit according to an embodiment of the present invention wherein the electrical leads for carrying differential signals are fabricated on opposite sides of a substrate, wherein a first electrical lead provides an etching mask for etching the second electrical lead.

FIGS. 3A-3H show a method of manufacturing the flex circuit according to an embodiment of the present invention wherein a first electrical lead provides an etching mask for etching the second electrical lead.

DETAILED DESCRIPTION OF EMBODIMENTS OF THE INVENTION

Figures 1A, 1B:
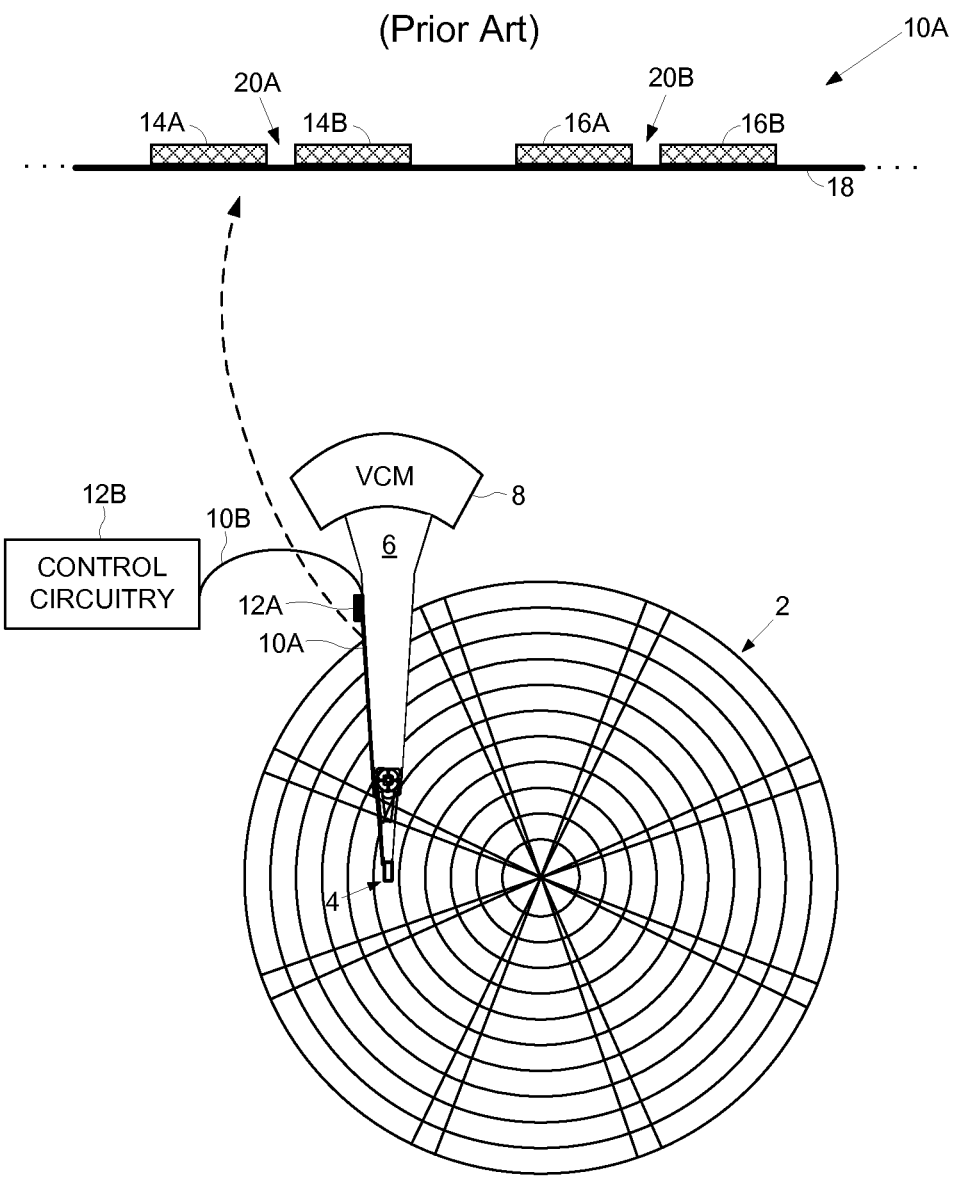
FIG. 1A shows a prior art disk drive comprising a head actuated over a disk and a flex circuit for coupling the head to control circuitry.
FIG. 1B shows a prior art flex circuit comprising electrical leads for carrying differential signals fabricated on a single side of a substrate.

FIG. 2A shows a disk drive according to an embodiment of the present invention including a disk 22, a head 24 actuated radially over the disk 22, control circuitry 26A and 26B, and a flex circuit 28A for electrically coupling the head 24 to the control circuitry 26A (a preamp in the example shown in FIG. 2A). The flex circuit 28A (FIG. 2B) comprises a substrate 30, a first electrical lead 32A coupled to a first side of the substrate 30, wherein the first electrical lead 32A is operable to conduct a first signal of a differential signal, and a second electrical lead 32B coupled to a second side of the substrate 30 opposite the first side, wherein the second electrical lead 32B is operable to conduct a second signal of the differential signal. The first electrical lead 32A provides an etching mask for etching the second electrical lead 32B, and the first electrical lead 32A is substantially aligned with the second electrical lead 32B such that the substrate 30 forms a capacitive dielectric.

In the embodiment of FIG. 2A, the head 24 is connected to a distal end of an actuator arm 36 which is rotated about a pivot by a voice coil motor 38 in order to actuate the head 24 radially over the disk 22. A first flex circuit 28A couples the head 24 to a preamp 26A mounted on the actuator arm 36, and a second flex circuit 28B couples the preamp 26A to other control circuitry 26B mounted on a printed circuit board. As the actuator arm 36 rotates, the second flex circuit 28B bends to facilitate the movement of the actuator arm 36. In an alternative embodiment, the preamp 26A is integrated with the other control circuitry 26B such that flex circuit 28A couples the head 24 directly to the control circuitry 26B mounted on the printed circuit board.

The flex circuit 28A may comprise electrical leads for carrying any suitable differential signal. In one embodiment, the head 24 comprises a magnetoresistive (MR) head comprising a write element having a first differential signal interface (e.g., 32A and 32B) and a read element having a second differential signal interface (e.g., 34A and 34B). As described above, it is desirable to reduce the impedance of the electrical leads carrying a differential signal in order to increase power efficiency as well as the signal-to-noise ratio (SNR) of the signals. The impedance can be reduced by increasing the capacitance between the electrical leads, and in the embodiment shown in FIG. 2B, the impedance is reduced due to the increased capacitance of the substrate 30. However, in order to take full advantage of the capacitive dielectric property of the substrate 30, in one embodiment the first electrical lead (e.g., 32A) is substantially aligned with the second electrical lead (e.g., 32B).

FIGS. 3A-3H show a method of manufacturing the flex circuit 28A according to an embodiment of the present invention so that the electrical leads carrying a differential signal are substantially aligned. Referring to FIG. 3A, an electrical coating 40 is applied to a first surface of a suitable substrate 30 (e.g., a polymide), wherein the electrical coating 40 may comprise any suitable material, such as a metal alloy comprising copper, beryllium copper, nickel, or compositions thereof. A suitable photoresist 42 (e.g., a suitable polymer) is applied over the electrical coating 40, and a mask 44 is placed over the photoresist 42 (FIG. 3B). A suitable radiation source (e.g., ultraviolet light or visible light) is directed at the first surface so as to cure the photoresist 42 not covered by the mask 44. Referring to FIG. 3C, the uncured photo resist 42 and underlying electrical coating 40 are removed (etched) using a suitable etchant solution, such as acid ferric chloride. The cured photoresist 42 shown in FIG. 3C is then removed (FIG. 3D) using a suitable solution, such as an organic solvent (e.g., methylene chloride), leaving the first electrical lead 32A shown in FIG. 2B.

During the step of etching the electrical coating 40 applied to the first side of the substrate 30 to form the first electrical lead 32A as described above with reference to FIGS. 3A-3D the mask 44 may be inverted if a positive photoresist 42 is employed. In this embodiment, the masked part of the photoresist 42 is cured when developed and the unmasked (and uncured) photoresist 42 is removed together with the underlying electrical coating 40 as shown in FIG. 3C.

Continuing now with FIG. 3E, the substrate 30 is flipped over so that the second side is facing up, and a photoresist 46 is applied to the second side. The first side of the substrate 30 is then irradiated as shown in FIG. 3E such that the first electrical lead 32A masks the radiation from passing through the substrate 30 to prevent curing of the photoresist 46 applied to the second side of the substrate 30, thereby forming an uncured photoresist and a cured photoresist on the second side of the substrate. In this embodiment, the substrate 30 is sufficiently transparent to pass the radiation, whereas the first lead 32A masks the radiation. Referring to FIG. 3F, the uncured photoresist 46 is removed from the second side of the substrate 30 to form a groove 48. Referring to FIG. 3G, the groove 48 is filled with electrically conductive material 50 using any suitable technique, such as a suitable deposition process (e.g., a liquid bath plating process or sputtering process). The cured photoresist 46 shown in FIG. 3G is then removed as shown in FIG. 3H, thereby forming the second electrical lead 32B shown in FIG. 2B.

As seen in FIG. 3H, the first electrical lead 32A is substantially aligned with the second electrical lead 32B such that the substrate 30 forms a capacitive dielectric. In one embodiment, the capacitive dielectric of the substrate 30 increases the capacitance of the electrical leads 32A and 32B as compared to the air dielectric shown in the prior art of FIG. 1B. Increasing the capacitance reduces the impedance of the electrical leads in order to increase power efficiency as well as the signal-to-noise ratio (SNR) of the differential signals.

What is claimed is:

1. A method of manufacturing a flex circuit for a disk drive, the disk drive comprising a disk, a head actuated radially over the disk, and control circuitry, wherein the flex circuit is for electrically coupling the head to the control circuitry and comprises a substrate, the method comprising:
    etching an electrical coating applied to a first side of the substrate to form a first electrical lead;
    irradiating the first side of the substrate with radiation such that the first electrical lead masks the radiation from passing through the substrate to prevent curing of a photoresist applied to a second side of the substrate, wherein the photoresist is formed into an uncured photoresist and a cured photoresist on the second side of the substrate;
    removing the uncured photoresist from the second side of the substrate to form a groove; and
    filling the groove with electrically conductive material to form a second electrical lead.

2. The method as recited in claim 1, wherein the first electrical lead is substantially aligned with the second electrical lead such that the substrate forms a capacitive dielectric.

3. The method as recited in claim 1, wherein the substrate comprises a polyimide.

4. The method as recited in claim 3, wherein the polyimide is sufficiently transparent to pass the radiation.

5. The method as recited in claim 4, wherein the radiation comprises ultraviolet light.

6. The method as recited in claim 4, wherein the radiation comprises visible light.

* * * * *